US009609780B2

(12) United States Patent
Eble et al.

(10) Patent No.: US 9,609,780 B2
(45) Date of Patent: Mar. 28, 2017

(54) OPTOELECTRONIC SENSOR HAVING AT LEAST TWO CIRCUIT BOARDS HELD VIA FUNCTIONAL ELEMENTS

(71) Applicant: SICK AG, Waldkirch (DE)

(72) Inventors: Johannes Eble, Waldkirch (DE); Sebastian Matt, Waldkirch (DE); Gerhard Alt, Waldkirch (DE); Jürgen Bürger, Waldkirch (DE)

(73) Assignee: SICK AG, Waldkirch (DE)

( * ) Notice: Subject to any disclaimer, the term of this patent is extended or adjusted under 35 U.S.C. 154(b) by 410 days.

(21) Appl. No.: 14/519,158

(22) Filed: Oct. 21, 2014

(65) Prior Publication Data

US 2015/0115181 A1 Apr. 30, 2015

(30) Foreign Application Priority Data

Oct. 29, 2013 (EP) .................................... 13190692

(51) Int. Cl.
 *H05K 7/14* (2006.01)
 *G01J 1/44* (2006.01)
 *G01V 8/20* (2006.01)
(52) U.S. Cl.
 CPC ............. *H05K 7/1418* (2013.01); *G01J 1/44* (2013.01); *G01V 8/20* (2013.01)
(58) Field of Classification Search
 CPC ....... G01J 1/44; H05K 1/0274; H05K 7/1418; H05K 2201/09918
 USPC ................................................ 250/221, 239
 See application file for complete search history.

(56) References Cited

U.S. PATENT DOCUMENTS

| 6,654,515 B2 * | 11/2003 | Kato ......................... G02B 6/43 385/129 |
| 2003/0103347 A1 | 6/2003 | Friend |
| 2010/0053956 A1 | 3/2010 | Park et al. |

FOREIGN PATENT DOCUMENTS

| DE | 202008002116 U1 | 6/2008 |
| EP | 2090906 A2 | 8/2009 |
| EP | 2209165 A1 | 7/2010 |

OTHER PUBLICATIONS

Search Report issued in European Application No. 13190692.7 dated Apr. 4, 2014 (Apr. 4, 2014), three (3) pages.

* cited by examiner

*Primary Examiner* — Que T Le
(74) *Attorney, Agent, or Firm* — Nath, Goldberg & Meyer; Jerald L. Meyer

(57) ABSTRACT

The invention relates to an optoelectronic sensor, in particular to a light grid (10), having at least two circuit boards (19, 19-*x*) which are to be arranged one after the other in a longitudinal direction (16, z direction) and on which a plurality of light transmitters (18) and/or light receivers (20) are arranged in series, wherein the circuit boards (19-1, 19-2) are fixed in a desired position with respect to one another by a functional element (34) and wherein the circuit boards (19-1, 19-2) are held in a housing (12). It is proposed to provide an improved optoelectronic sensor, in particular a light grid, that the housing (12) is configured as a section and the circuit boards (19-1, 19-2) are held via the functional elements (34) in oppositely disposed grooves (50, 52) of the section (12) which extend in the longitudinal direction (16, z direction) so that the functional elements (34) position the circuit boards (19-1, 19-2) in a fixed position perpendicular (in the x-y plane) to the longitudinal direction (16, z direction).

14 Claims, 3 Drawing Sheets

Figure 1:
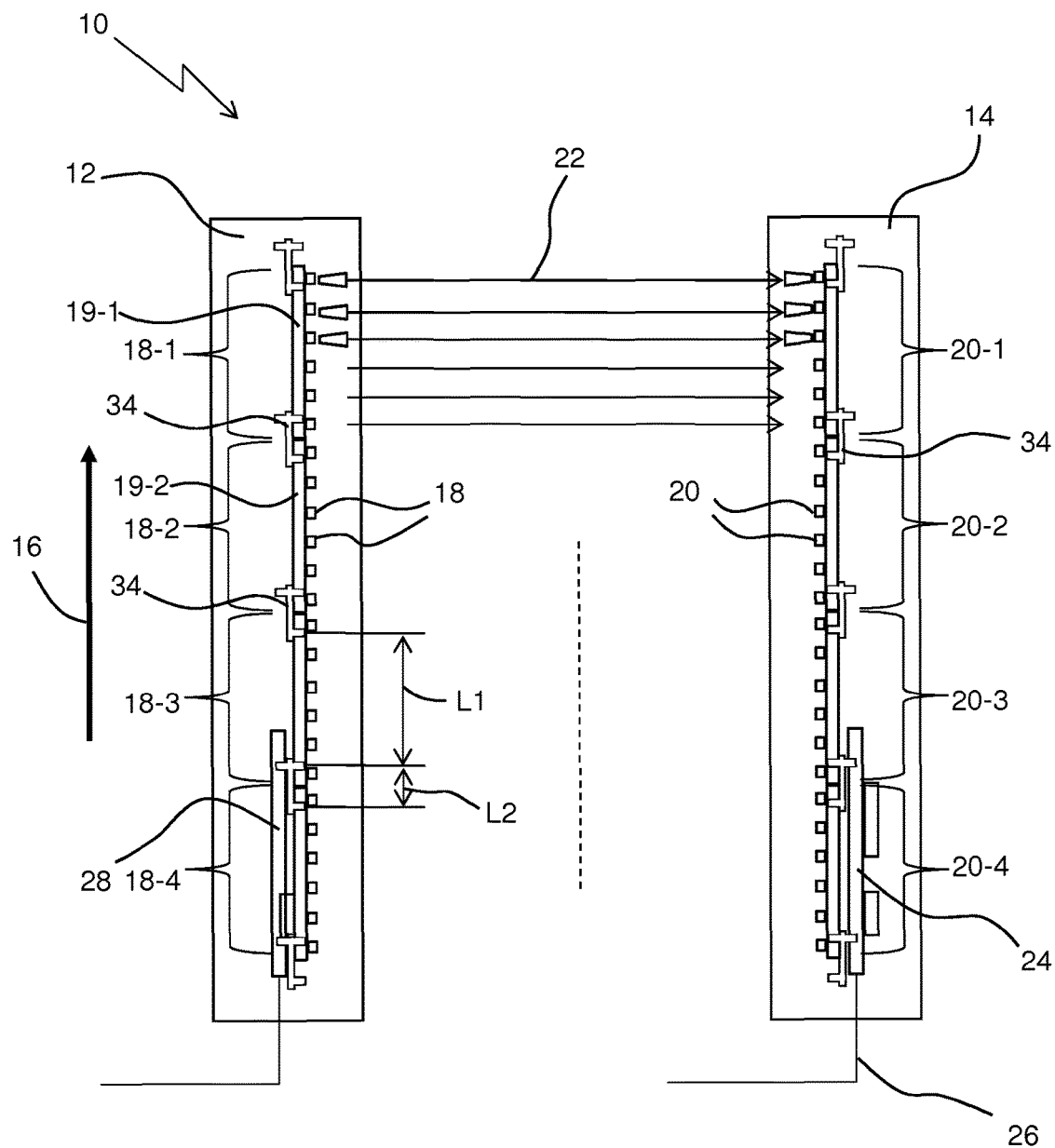

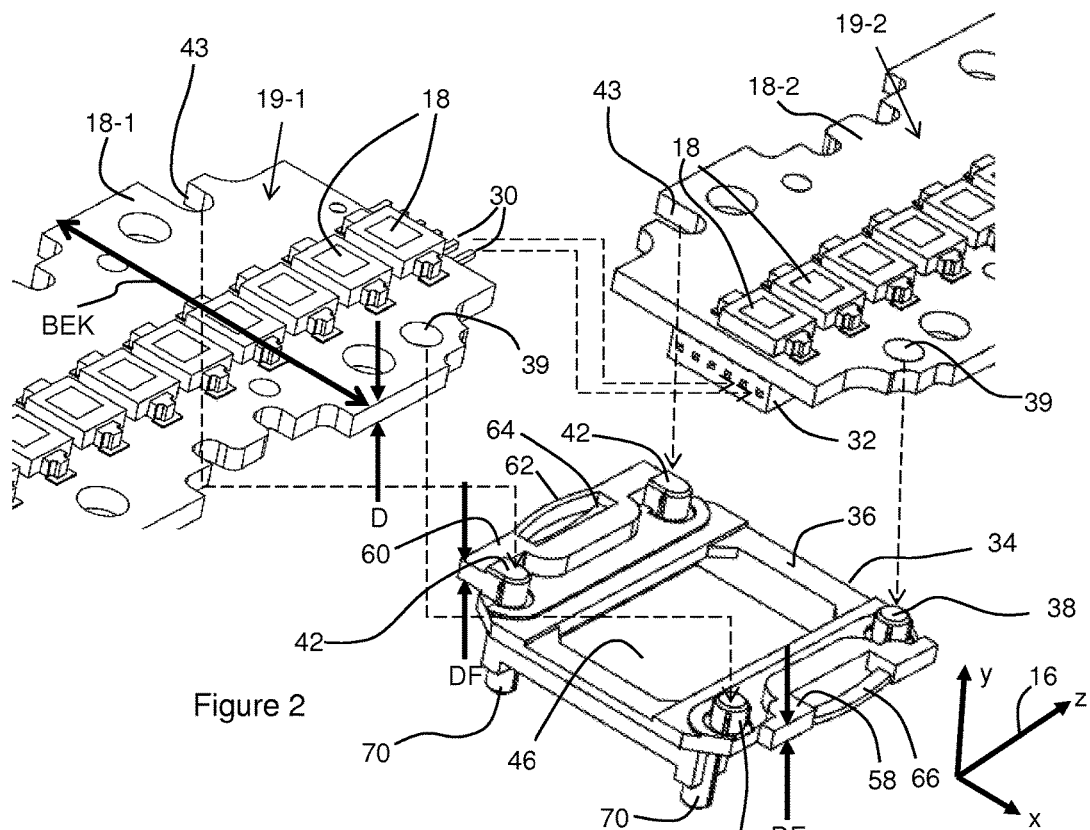
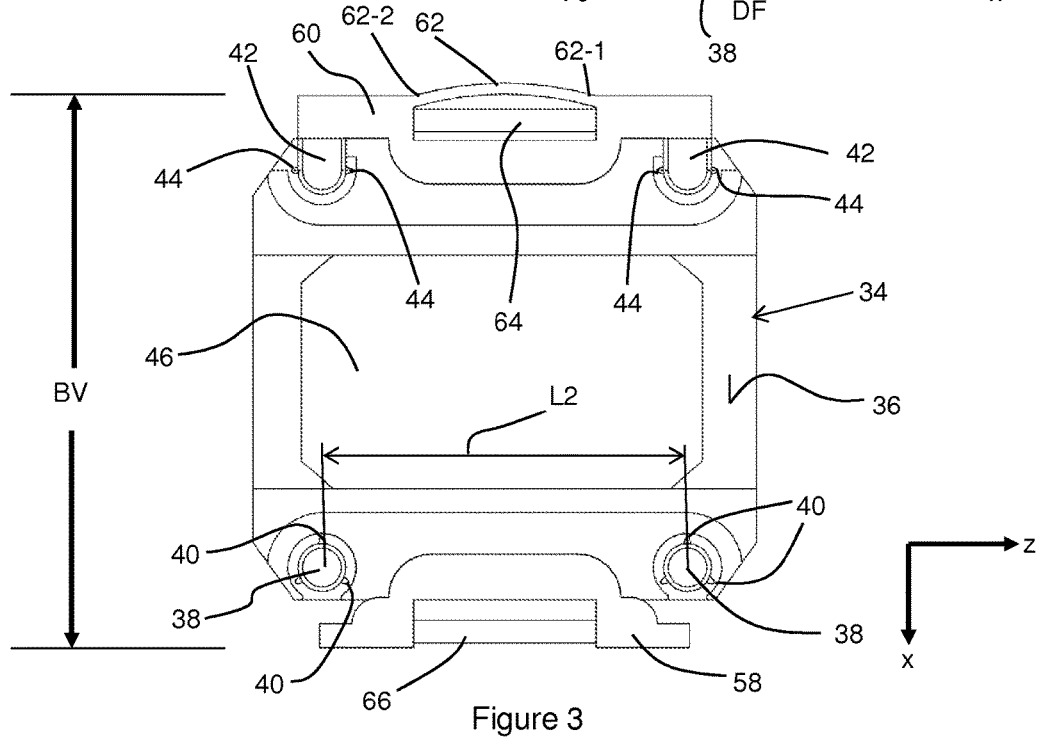

OPTOELECTRONIC SENSOR HAVING AT LEAST TWO CIRCUIT BOARDS HELD VIA FUNCTIONAL ELEMENTS

The invention relates to an optoelectronic sensor, in particular to a light grid, having at least two circuit boards which are to be arranged one after the other in a longitudinal direction and on which a plurality of light transmitters and/or light receivers are arranged in series, wherein the circuit boards are fixed in a desired position relative to one another by a functional element and the circuit boards are held in a housing.

Such light grids as a rule comprise a transmission strip, that is an elongate housing, in which light transmitters are arranged in series and a reception strip in which a number of light receivers corresponding to the number of transmitters are arranged in series so that a respective light transmitter and a light receiver are associated with one another. The light transmitters and light receivers do not necessarily have to be arranged separately in different housings. Light grids are also known in which both light transmitters and light transmitters are arranged in one housing.

Such light grids are used in a great variety of manners. This requires a very high flexibility in design ("modular system"), which in turn results in technically extreme challenges. A variety of problems arise to obtain high system performance with the most varied characteristics of the light grid.

The transmission units and reception units, that is the light transmitters with possible transmission optics (optical module) and light receivers with possible reception optics, have to be positioned as exactly as possible relative to the housing since the exactness of the positioning has an effect on the angle of irradiation and reception respectively and thus correlates directly with the system performance with respect to, for example, the range or squint angle between the transmission elements or reception elements. The transmission units and reception units are as a rule arranged (soldered) on circuit boards so that the circuit boards and the optical modules should be connected to the housing with as small a tolerance as possible for the exact positioning of the circuit boards.

A different number of circuit boards or optical modules has to be appended to one another since light grids are required and manufactured in different lengths (different monitored field size). A plurality of transmission modules and reception modules respectively (circuit board plus optical modules) are connected to one another in dependence on the device length and are inserted into a corresponding housing.

Such light grids have a substantial length in some cases, e.g. more than a meter, these circuit boards have to be fixed firmly with respect to one another so that the circuit boards cannot be displaced relative to one another.

In order to maintain an adjustment of the light transmitters and light receivers in operation, in particular with long light grids, the chain of transmission units and reception units is guided over the optical modules in the section in known light grids. Such a known guidance is, however, not possible if the option should be kept open of dispensing with the optical modules, e.g. for cost reasons or to use the multiple cross-beam technology.

The only option then is to hold the circuit boards themselves (and not the optical modules) in the housing. In this respect, the exactness in the beam alignment and in the beam pattern, that is the spacing of the light beams from one another, has to be ensured despite the high tolerance in thickness and width of the circuit boards. This is important since the exactness of the beam pattern determines the system performance with respect to exactness of height determinations via the number of interrupted light beams. Particularly with small beam patterns (e.g. grid spacing 2.5 mm), the tolerance of circuit board to circuit board has a substantial (interfering) influence. It is known in this respect from EP 2 090 906 A2 to connect adjacent circuit boards to one another in fixed position via plastic connection elements which simultaneously establish the electronic connection.

Temperature variations also represent a large problem. The housing typically comprises an aluminum section. The different components (FR4 for the circuit board and aluminum for the housing as well as plastic for other components) differ in their material properties (coefficient of longitudinal expansion). With long devices and/or large temperature differences, great variations arise, strains can occur in the device or the transmission/reception modules can be displaced relative to the housing. This can impair the system performance or lead to assembly problems. So that the device can be used over a large temperature range, provision must be made as much as possible that the expansion of the circuit board chain relative to the housing is as small as possible.

The assembly of such light grids represents a further problem area. The circuit boards are typically held in oppositely disposed grooves in the sectional housing. In particular with long devices which are set up with a length of up to several meters, large tolerances of the circuit boards with respect to thickness and width result in increased insertion forces (tilting and canting of the circuit boards in the section), which makes the set-up substantially more difficult. Ideally, the force which has to be applied for inserting the chain into the housing should be minimal.

Further strains which a light grid is exposed to are vibration strains and shock strains which in particular have an interfering effect when there is a clearance between the individual components. Not only losses in system performance occur, but parts can also be destroyed. It is therefore desirable to hold the circuit board chain in the housing as free of clearance as possible.

Starting from this prior art, it is the object of the invention to provide an improved optoelectronic sensor, in particular a light grid, with which as many of the aforesaid problems as possible can advantageously be solved or at least reduced.

This object is satisfied by a sensor having the features of claim 1.

The optoelectronic sensor in accordance with the invention is in particular a light grid. It comprises at least two circuit boards which are to be arranged one after the other in a longitudinal direction (z direction) and on which a plurality of light transmitters and/or light receivers are arranged in series, wherein the circuit boards are fixed in a desired position relative to one another by a functional element and the circuit boards are held in a housing. In accordance with the invention, the housing is configured as a section and the circuit boards are held via the functional elements in oppositely disposed grooves which extend in the longitudinal direction (z direction) so that the functional elements position the circuit boards in a fixed position perpendicular (in the x-y plane) to the longitudinal direction.

The exact positioning and fixing of the transmitters and/or receivers now no longer takes place via the circuit boards alone or via optical modules connected to the circuit board, but rather via the functional elements. For this purpose, each circuit board should preferably be held at both ends via such a functional element. It is understood that the transmission elements and reception elements arranged on the circuit boards have an exactly defined position for this purpose and are thus ultimately also positioned in an exactly defined manner with respect to the functional elements. The light beams are thus ideally adjusted and have exact availability angles and minimal squint angles.

A light grid having such a holder provides a number of advantages and solves a number of the named problems.

Since the circuit board chain is guided via the functional elements and not via optical modules in the section, the optical modules can be dispensed with for desired system variants. This makes it possible to provide less expensive light grid variants or variants having improved cross-beam performance.

In this respect, an exact alignment and positioning of the transmission/reception modules is ensured relative to the housing in the x, y and z directions, with the existing tolerances in the circuit boards and in the housing section being "contained".

The temperature independence and thus the relative longitudinal expansion of the housing and the circuit board chain can be "set" via the temperature behavior of the functional elements connecting the circuit boards such that as little relative change of the total chain as possible takes place with respect to the housing.

Since the chain with the circuit boards and their functional elements is only held in the groove at points, that is via the functional elements, a small insertion force is advantageously necessary on the introduction of the chain into the section. In this respect, a high positional exactness of circuit board to circuit board and thus an exact beam pattern is obtained. It is advantageous in this respect for the functional elements to be as short as possible in comparison with the circuit boards.

Provision is made in a further development of the invention for a positioning of the transmission elements and reception elements which is as exact as possible in relation to the housing and from circuit board to circuit board that the functional element is of areal design and contacts the circuit boards areally and that first and second reference spigots are provided which project from the flat sides for the positionally fixed connection of the functional element to the circuit boards. In this respect, the reference spigots are preferably inserted in first and second reference bores of the circuit boards on the connection. The transmission elements and reception elements are positioned in an exactly defined manner with respect to the reference bores so that ultimately a pattern measure, that is the spacing of the light beams of the light grid, is observed exactly over the full length of the light grid.

The robustness of the system in accordance with the invention with respect to vibration strains and shock strains is increased since the circuit boards are fixedly held in the groove via the functional elements transversely to the longitudinal direction, that is in the x-y plane. This applies in particular to the embodiment when the functional element has at least one first spring element and at least one second spring element so that the functional element is fixed perpendicular to the longitudinal direction, but is held displaceably in the longitudinal direction, by resiliently elastic contact between groove walls, on the one hand, and groove bases, on the other hand. A holding is thus possible which is completely free of clearance and thus correspondingly shock-resistant, but which simultaneously allows an introduction of the circuit board chain into the grooves with less insertion force.

The functional elements in accordance with the invention allow an electrical connection of adjacent circuit boards separate therefrom. This has the advantage that the electrical contact is free of mechanical demands. Simple contact pins are sufficient which can be introduced into corresponding sockets in a straight lines and which do not require any complex, expensive mechanical locking. The electrical connection is thus always ensured and the circuit boards, and thus the electrical connections, cannot move apart due to temperature expansions or shock.

The above-mentioned spring elements can be configured in various embodiments. The spring elements can be formed by arcs whose ends are connected to the functional element and whose arched centers are supported against the groove base or the groove wall. Or the spring elements can be configured with a unilateral suspension and can thus be configured like a spring arm whose free end is supported at the groove base or at the groove wall.

In an alternative, the spring elements can also be configured as displacement elements which are sheared off to the dimension of the groove on the insertion into the section. Such types of spring elements can only be used once.

In a further development of the invention, the reference spigots have displacement ribs for a better connection to the circuit board which are sheared off on the assembly in dependence on the borehole diameter of the circuit board. The tolerances of the borehole diameters of the circuit boards can thus be contained to establish a clearance-free connection to the circuit board and between the circuit boards. The number of reference spigots of the functional element can vary.

In a further development of the invention, third reference spigots are provided on the other flat side for holding a further circuit board in parallel with the connected circuit boards. The further circuit board can additionally be positioned in a separate section groove relative to the first circuit boards.

In a further embodiment, the functional element has a central cut-out for positioning an electrical connector for the circuit boards. This connection can be ensured by a simple plug-and-socket part, with the plug part being able to be a simple pin strip. A mechanical locking of the plug and socket is not necessary.

The latter has reinforcement ribs on at least one of the flat sides of the functional element, which are advantageously designed in accordance with the occurring forces, for stabilizing and reinforcing the functional element.

The functional element is preferably made from plastic as an injection molded part in an inexpensive manner. It has very small tolerances with respect to dimensions as an injection molded part. It is also conceivable that the functional element is manufactured differently from other materials, e.g. as a cast metal or from ceramic material.

The ratio of the spacing of the reference spigots on a functional element viewed in a longitudinal direction to the spacing of the reference bores on a circuit board viewed in the longitudinal direction is selected for a direct temperature dependence such that the longitudinal expansion of the circuit board chain comprising the circuit boards connected to one another via the functional elements approximately corresponds to the longitudinal expansion of the housing. In this respect, the actually interfering temperature behavior of the plastic of the functional element is therefore utilized to compensate the difference in the temperature behaviors of the housing and the circuit board material.

The functional element can partly or completely surround at least one of the adjacent circuit boards.

The invention will be explained in detail in the following with reference to embodiments and to the drawing. There are shown in the drawing:

FIG. 1 a schematic representation of a light grid in accordance with the invention;

FIG. 2 a representation of the connection of two adjacent circuit boards;

FIG. 3 a plan view of a functional element; and

Figure 4:
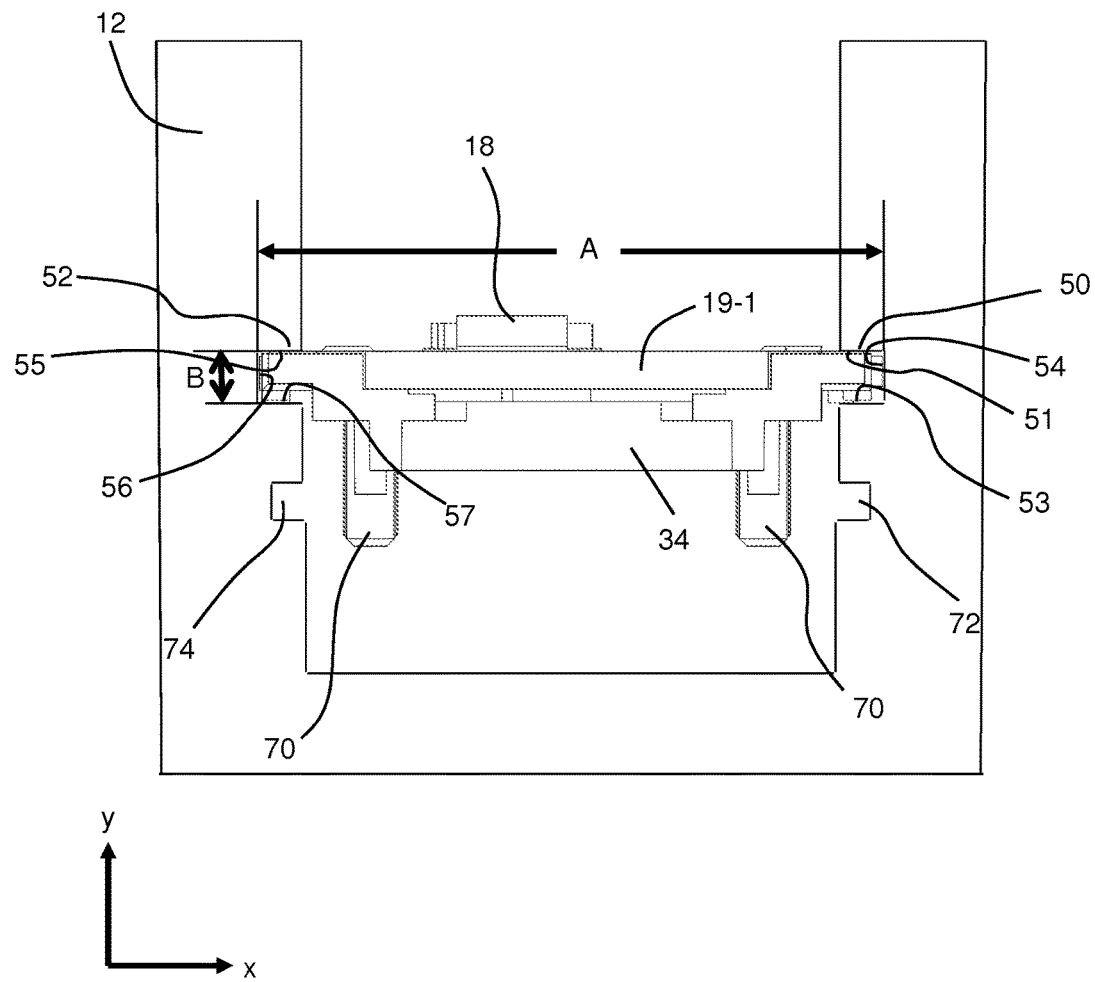

FIG. 4 an end view of the housing section with inserted circuit board and functional element.

An optoelectronic sensor in accordance with the invention is configured as a light grid 10 in this embodiment. The light grid 10 has a transmitter housing 12 and a receiver housing 14 which, on the one hand, have a row of light transmitters 18 arranged in the longitudinal direction 16 (in the following also the z direction) or a row of receivers 20 arranged in the longitudinal direction respectively. A receiver 20 is associated in an oppositely disposed manner with each light transmitter 18 so that there is a respective light beam 22 between the transmitter/receiver pairs. The light beams 22 in their totality define a planar monitoring field which is monitored as to whether one or more of the light beams 22 are interrupted by an object, not shown. Such an interruption is evaluated in receiver electronics 24 and a corresponding switching signal is output to an output 26. Control electronics 28 for controlling the light transmitters 18 are provided at the transmitter side.

The light beams 22 have an exact spacing which is as uniform as possible and which is also called a grid dimension.

The row of light transmitters 18 or the row of light receivers 20 is formed by individual modules 18-1 to 18-4 or 20-1 to 20-4 strung together. Differently long rows of the same modules for light grids 10 of different sizes can be set up using this modular design. Each individual module comprises a circuit board 19 on which at least one specific number of light transmitters 18 or receivers 20 are arranged. In the example shown in FIG. 1, a respective six light transmitters 18 and receivers 20 are shown by way of example. Adjacent modules, for example 18-1 and 18-2, have to be connected to one another mechanically, on the one hand, and electrically, on the other hand. The mechanical connection, positioning and holding are in particular the subject matter of this invention. For only if the connection from module to module is exact and if the modules are positioned and held exactly in the housing 12, 14 can an exact grid dimension be observed over the length of the light grid 10.

The connection of, for example, the modules 18-2 and 18-2 is shown by way of example in detail in FIG. 2.

The electrical connection takes place via a simple plug-and-socket connection. For this purpose, a plug is arranged at the circuit board 19-1 of the module 18-2, with only the plug pins 30 thereof being able to be recognized in FIG. 2, and a corresponding socket strip 32 is arranged at the circuit board 19-2 of the module 18-2 for receiving the plug pins 30.

The mechanical connection takes place via a functional element 34 which represents the major part of the invention. The functional element 34 is substantially areal, with the circuit boards 19-1 and 19-2 lying on a flat side 36 which forms the upper side in the view of FIG. 2.

In addition, the functional element 34 has two first reference spigots 38 which are round in cross-section and which are introduced into first references bores 39 provided on the circuit boards 19-1 and 19-2 on the assembly. In addition, each reference spigot 38 has displacement ribs 40 which are sheared off on the assembly. Furthermore, the functional element 34 has two reference spigots 42 which are elongated in cross-section and are half-round at a side. The second reference spigots 42 likewise have displacement ribs 44. The first reference spigots 38 serve for the exact positioning of the circuit boards 19-1 and 19-2 and the second reference spigots 42 serve for a stable connection between the functional element 34 and the circuit board 19-1 or 19-2 respectively. In this respect, the second reference spigots 42 are received in half-open second reference bores 43.

In the inner region of the functional element 34, the functional element 34 has a larger rectangular cut-out 46 in which the plug-and-socket connection is arranged on the assembly. The assembly and connection of two circuit boards 19-1 and 19-2 via the functional element 34 takes place in two steps, with the electrical connection being established in the first step and then the circuit boards 19-1 and 19-2 connected in this manner being connected to the functional element 34.

The circuit boards 19 connected via the functional elements 34 in this manner are then introduced into the housing 12 or 14 in the further assembly of the light grid. Such a housing is shown in cross-section in FIG. 4 (here the transmitter housing 12 by way of example, with the receiver housing 14 having an identical design). In this representation, only the actual housing 12 and an inserted circuit board 19-2 having a light transmitter 18 and a functional element 34 are shown. Other major components of the light grid such as a transmission optics (above the transmitter 18) or a front screen closing the open side of the section or electrical lines and plugs are not shown for reasons of simplicity since they do not play any role for the further understanding.

The housing 12 is preferably configured as an aluminum section and has two oppositely disposed grooves 50 and 52 at the inner side. The housing 12 could also comprise plastic. The two grooves 50 and 52 serve for the reception of the circuit board chain which comprises the modules 18-1 to 18-4 which are strung together and which are connected via the functional elements 34.

In this embodiment, the grooves 50 and 52 have a width B and a spacing A from one another, with the spacing A of a groove base 54 of the one groove 50 from the groove base 56 of the other groove 52 being defined. The circuit boards 19 have a width BEK and a thickness D, with the width BEK being somewhat smaller than the spacing A and with the thickness D being somewhat smaller than the groove width B. The groove width B is defined as the spacing of the parallel groove walls 51 and 53 of the groove 50, on the one hand, and of the groove walls 55 and 57 of the groove 52, on the other hand. The circuit boards 19 alone would therefore thus be held in the grooves 50 and 52 with a little clearance. Other, namely smaller, dimensions of the circuit boards are conceivable. Those named here by way of example are, however, advantageous since then the circuit boards are guided roughly, namely with clearance, in the grooves solely due to their size. The exact positioning finally takes place via the functional elements 34.

The functional element 34 has a first and a second prolongation 58 and 60 on the named upper side 56, beside the reference spigots 38 and 42, at both longitudinal sides which extend in parallel with the longitudinal direction. The circuit boards 19-1 and 19-2 are, on the one hand, laterally guided between the prolongations and, on the other hand, these prolongations 58 and 60 have spring elements.

The second prolongation 60 in this respect has a first spring element 62 which is formed by an arc which is fastened at its two ends 62-1 and 62-2 and whose arch arches slightly outwardly so that the arch slightly projects beyond the width BV of the functional element. In an analog manner, a second spring element 64 is provided at the second prolongation 60; it is, however, aligned differently, its arching is namely rotated by 90° about the longitudinal direction 16 and thus projects slightly beyond the thickness DF of the prolongation 60, as is indicated in FIG. 2. The first prolongation 58, like the second prolongation 60, has such a second spring element 66. The arching of the second spring elements 64 and 66 projects downwardly beyond the prolongations in the alignment shown in FIG. 2. The thickness DF of the prolongations is somewhat smaller than the thickness D of the circuit boards 19.

If now the circuit board chain with the modules 18 and the functional elements 34 is inserted into the housing 12, the upper sides (FIGS. 2 and 4) of the circuit boards 19, which are higher than the reference spigots, come into contact with the groove walls 51 and 55 and are held with preload by the spring elements 64 and 66 which are supported at their arching portions against the other groove walls 53 and 57. The circuit board chain is thus fixed in the y direction (FIG. 4) and is held without clearance and with preload.

In the x direction (FIG. 4), the longitudinal sides of the first prolongation 66 of the functional elements 44 come into contact with the groove base 54 of the groove 50. In the other groove 52, the arch of the spring element 62 comes into contact with the groove base 56 and thus fixes the functional element 34 without clearance and with preload in the x direction.

An exact positioning, alignment and clearance-free fixing in the x-y plane, and thus perpendicular to the longitudinal direction (z direction), is thus obtained overall.

The functional elements 34 thus form the central carrier system for the circuit board chain in the section groove. Only the upper side of the circuit boards and, at points, the arches of the spring elements, have contact with the groove walls and the groove bases.

So that the outer modules (the last modules 18-2 and 20-1 respectively and 18-4 and 20.4 respectively of the row in FIG. 1) are also held at their ends via the functional elements 34, functional elements 34 are also arranged at the two ends of the rows even though no further module has to be connected to the last module any longer there. These connection elements at the ends therefore only have the object of holding in the grooves 50 and 52.

In the z direction, that is in the longitudinal direction, the circuit board chain is held fixed in a manner not shown via, for example, end caps for the housing section 12 and 14 respectively.

The functional element 34 is preferably configured as an injection molded part from plastic. Since the material properties of aluminum of the housing and of FR4 of the circuit boards are similar with respect to longitudinal expansion, the aluminum section and the chain of circuit boards plus bond likewise behave similarly on a temperature change. Since FR4 material expands minimally less than aluminum, and plastic in turn considerably more, the temperature expansion behavior of the total circuit board chain can be influenced via a ratio L1/L2, where L1 is the spacing of the first and second reference bores 39 and 43 respectively on a circuit board (FIG. 1) and L2 is the spacing of the first or second reference spigots 38 and 42 respectively, such that this behavior is adapted to that of the housing 12. The coefficient of expansion is thus compensated largely to zero. The length difference between the total chain and the housing is thereby cancelled or considerably reduced.

In an embodiment, the functional element has third reference spigots 70 at the lower side (in accordance with FIGS. 2 and 4). These third reference spigots 70 serve for the holding of a further circuit board (not shown) which can itself in turn roughly be guided in further grooves 72 and 74. Since this further circuit board does not carry any optical elements and accordingly also does not have to be positioned exactly, the high positional demands are dispensed with there so that a rough guidance in the grooves 72 and 74 is sufficient.

Finally, for reasons of completeness, some major functions and advantages of the functional element 34 will be listed again. The functional element 34
- connects the circuit boards highly precisely so that the transmission and reception elements 18, 22 satisfy the grid dimension highly precisely via the highly precise reference bores 39, 43;
- serves as a strain relief of the electrical connection 30, 32;
- positions the circuit boards highly precisely in the x-y direction with respect to the housing and positions adjacent circuit boards highly precisely with respect to one another in the z direction so that the grid dimension is observed;
- compensates the temperature expansion.

The invention claimed is:

1. An optoelectronic sensor, in particular a light grid (10), having at least two circuit boards (19, 19-x) which are to be arranged one after the other in a longitudinal direction (16, z direction) and on which a plurality of light transmitters (18) and/or light receivers (20) are arranged in series, wherein the circuit boards (19-1, 19-2) are fixed in a desired position with respect to one another by a functional element (34), wherein the circuit boards (19-1, 19-2) are held in a housing (12) and wherein the housing (12) is configured as a section and the circuit boards (19-1, 19-2) are held via the functional elements (34) in oppositely disposed grooves (50, 52) of the section (12) which extend in the longitudinal direction (16, z direction) so that the functional elements (34) position the circuit boards (19-1, 19-2) in a fixed position perpendicular (in the x-y plane) to the longitudinal direction (16, z direction).

2. A sensor in accordance with claim 1, wherein the oppositely disposed grooves each have groove walls and a groove base and wherein each functional element has at least one first spring element and at least one second spring element so that the functional element is fixed perpendicular to the longitudinal direction, but is resiliently displaceably held in the longitudinal direction.

3. A sensor in accordance with claim 2, wherein the at least one first spring element and the at least one second spring element engage in respective ones of said oppositely disposed grooves and resiliently elastic contact at least one of a groove wall and a groove base.

4. A sensor in accordance with claim 1, wherein each functional element has first and second sides and has areal contact with a circuit board; and in that first and second reference spigots are provided which project from one of the sides for the positionally fixed connection of the functional element to the circuit board.

5. A sensor in accordance with claim 4, wherein said first and second sides have respective flat contact areas for a circuit board.

6. A sensor in accordance with claim 4, wherein the circuit boards have first and second reference bores for receiving the reference spigots.

7. A sensor in accordance with claim 4, characterized in that the reference spigots have displacement ribs for a force-transmitting connection of the functional element to a circuit board.

8. A sensor in accordance with claim 4, wherein third spigots are provided on the other one of the first and second sides for holding a further circuit board in parallel with a circuit board connected to the first and second reference spigots.

9. A sensor in accordance with claim 1, wherein the functional element has a central cut-out for the positioning of an electrical connector for a circuit board.

10. A sensor in accordance with claim 1, wherein each functional element is adapted to connect with first and second circuit boards.

11. A sensor in accordance with claim 10, wherein said first circuit board has an first electrical connector and said second circuit board has a second electrical connector adapted to mate with said first electrical connector and each said functional element has a cut out adapted to receive the mating first and second electrical connectors.

12. A sensor in accordance with claim 4, wherein reinforcement ribs are provided at at least one of the first and second sides of the functional element.

13. A sensor in accordance with claim 1, wherein each functional element is formed as an injection molded part from plastic.

14. A sensor in accordance with claim 1, wherein a ratio of the spacing of longitudinally spaced reference spigots on a functional element to a spacing of the longitudinally spaced reference bores on first and second circuit boards respectively engaging the longitudinally spaced reference spigots is selected such that the longitudinal expansion of a circuit board chain comprising a plurality of circuit boards connected to one another via functional elements approximately corresponds to a longitudinal expansion of the housing.

* * * * *